Figure 1:
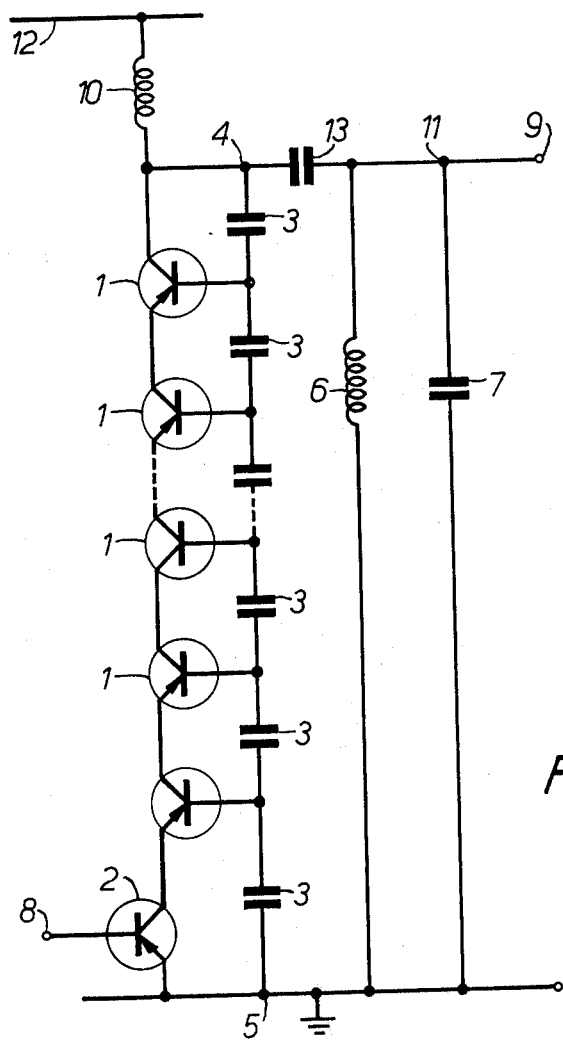

United States Patent [19]

Sosin

[11] 4,319,198

[45] Mar. 9, 1982

[54] POWER AMPLIFIERS

[75] Inventor: Boleslaw M. Sosin, Chelmsford, England

[73] Assignee: The Marconi Company Limited, Chelmsford, England

[21] Appl. No.: 113,266

[22] Filed: Jan. 18, 1980

[30] Foreign Application Priority Data

Jan. 23, 1979 [GB] United Kingdom ............... 02411/79

[51] Int. Cl.³ .............................................. H03F 3/191
[52] U.S. Cl. ................................... 330/296; 330/306; 330/311
[58] Field of Search ................... 330/70, 71, 302, 305, 330/306, 310, 311, 296

[56] References Cited

U.S. PATENT DOCUMENTS 2,052,986  9/1936  Nyman .................................. 330/70

Primary Examiner—James B. Mullins
Attorney, Agent, or Firm—Spencer & Kaye

[57] ABSTRACT

A high frequency power amplifier consists of a large number of serially connected transistors. The base connections of the transistors are connected to a potential divider consisting of reactive components, usually capacitors, which form part of a tuned circuit which is resonant at the frequencies at which the amplifier is to be used. The resonant currents flowing in the potential divider ensure that sufficient base current is available for the transistors to provide the required amplification.

4 Claims, 2 Drawing Figures

U.S. Patent     Mar. 9, 1982     4,319,198

POWER AMPLIFIERS

This invention relates to power amplifiers and is particularly applicable to power amplifiers which are intended to amplify signals having high frequencies, that is to say, typically frequencies above 250 kHz, although this frequency is given only by way of example. It has been common in the past to use vacuum amplifying tubes as the active elements in high frequency power amplifiers, as the use of transistors has presented many difficulties. Since individual transistors are relatively low power devices, it has been usual to connect a number of transistors together either in parallel or in series in order to achieve a reasonably high power level. However, the use of individual transistors in parallel is basically unsatisfactory, since great difficulties arise due to their very low terminal impedances and the instability which is due to the negative temperature co-efficients of the impedances of the individual transistors. The alternative expedient of connecting a number of transistors in series has caused difficulties in correctly biassing the individual transistors, and the expedient of providing a chain of resistors arranged to act as potential dividers, as is known in connection with low frequency amplifiers, is impracticable at high frequencies because the resistors dissipate almost all of the generated power at these high frequencies.

The present invention seeks to provide an improved amplifier which is capable of using transistors as the active elements in a reasonably efficient manner.

According to this invention, a high frequency power amplifier comprises a plurality of transistors coupled together with their collector-emitter paths connected in series; a chain of reactive components connected in series to form a potential divider with the base connections of the individual transistors connected to respective points on the potential divider, the reactive components forming part of a resonant tuned circuit connected in the output path of said amplifier; and means for applying high frequency input signals to said transistors.

The reactive components forming the potential divider are preferably capacitors, although inductors could be used instead.

The means for applying the high frequency input signals to said transistors preferably comprises a further transistor, which may be connected with its collector-emitter path in series with the collector-emitter paths of the remaining transistors, in which case the input signals are applied to its base connection, or alternately the input signals can be applied to its emitter connection, in which case its base connection is connected to a point on the potential divider, and its collector is connected to the remaining transistors.

The resonant circuit should be arranged to possess a sufficiently high Q-value so that at or near resonance the currents flowing through the potential divider are much greater in magnitude than the base currents needed to drive the transistors connected to the potential divider, so as to ensure that the individual transistors are correctly biassed.

Figure 2:
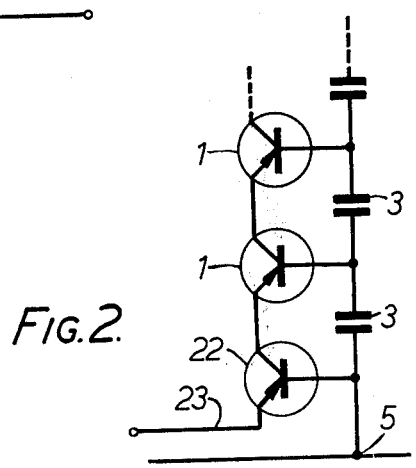

The invention is further described by way of example with reference to the accompanying drawings in which, FIG. 1 shows a power amplifier in accordance with the present invention and FIG. 2 shows a modification thereof.

Referring to FIG. 1, the transistor amplifier consists of a plurality of transistors 1 in which their collector-emitter paths are connected in series with that of an input transistor 2. In operation, a high frequency signal to be amplified is applied to the base terminal of transistor 2 via an input terminal 8. The base terminals of the transistors 1 are connected between adjacent pairs of capacitors 3 which form a potential divider connected between two points 4 and 5. In practice, point 5 may be connected to ground potential and point 4 is connected via an inductor 10 to a high positive potential, typically several hundred volts. Although only five transistors 1 are shown, in practice as many more as are necessary would be provided in dependence on the value of the potential applied to voltage bus 12 and the maximum operating voltages of the transistors. Each capacitor 3 has the same value, and they form part of a resonant tuned circuit which also includes the inductor 6 and the capacitor 7. The capacitor 13 is a large value blocking capacitor and is provided to prevent the existence of a d.c. path between bus 12 and ground via the inductors 6 and 10. As it has a large value it presents an almost zero a.c. impedance. The tuned circuit so formed is resonant at the frequencies at which the amplifier is to be used, i.e. the signal applied at input terminal 8 is at approximately the resonant frequency of the tuned circuit.

The high reactive currents flowing through the capacitors 3 in the resonant tuned circuit maintain the required potentials on the respective base connections of the transistors 1 so that they are correctly biassed into conduction. It is important that the current flowing through the capacitors 3 should be significantly greater than the base currents required to provide the necessary degree of current amplification. The use of a resonant tuned circuit enables this requirement to be met without the need to dissipate an unacceptably large amount of energy in the chain of components which constitutes the potential dividers. The Q-value of the resonant circuit determines the value of the current flowing through the capacitors 3. A satisfactory value is expected to be about ten, but this value is not thought to be critical, although the lowest useful value of Q is likely to be about three.

Although the inductor 6 is shown connected in shunt across the points 4 and 5, the inductor may instead be connected in series with the output terminal 9 between the points 4 and 11. Furthermore, the potential divider may be constituted by a series of inductors instead of the capacitors 3, but this arrangement is not preferred since this would create problems with the d.c. supply to the transistors, and would require the insertion of further large value blocking capacitors.

An alternative input arrangement is indicated in FIG. 2 in which the base of the input transistors 22 is connected to one end of the potential divider at point 5, and the input signal is applied to its emitter connection 23. The remainder of the circuit is as shown in FIG. 1.

In FIGS. 1 and 2 only the a.c. bias currents for the base connections of the amplifying transistors have been shown, and in practice appropriate circuits for the required d.c. bias would also be provided, but these could be of a conventional nature.

Although an amplifier in accordance with this invention is clearly not capable of operating over a very broad band, since its useful operating frequency range is determined by the sharpness of the resonance of the tuned circuit, in practice this is unlikely to be a serious disadvantage, since many high frequency amplifiers are intended to operate over only a narrow frequency range. In addition, it is already common to provide a tuned circuit in the output of a high frequency amplifier so as to provide matching to subsequent frequency sensitive components such as transmission lines or antennas. Where a tuned circuit is required for this purpose it can also advantageously be arranged to form part of the tuned circuit which provides the required operating potentials to the base connections of the transistors 1.

We claim:

1. A high frequency power amplifier including a plurality of transistors coupled together with their collector-emitter paths connected in series; a chain of reactive components connected in series to form an a.c. potential divider with the base connections of the individual transistors connected to respective points on the potential divider, the reactive components forming part of a resonant tuned circuit connected in the output path of said amplifier; and means for applying high frequency input signals to said transistors.

2. An amplifier as claimed in claim 1 and wherein the reactive components forming the potential divider are capacitors.

3. An amplifier as claimed in claim 1 or 2 and wherein the means for applying the high frequency input signals to said transistors comprises a further transistor which is connected with it collector-emitter path in series with the collector-emitter paths of the remaining transistors, with the base connection of the further transistor being arranged to receive the applied input signals.

4. An amplifier as claimed in claim 1 or 2 and wherein the means for applying the high frequency input signals to said transistors comprises a further transistor arranged with its base connection connected to a point on the potential divider, its collector connection connected to the remaining transistors, and its emitter connection arranged to receive the applied input signals.

* * * * *